US005644103A

United States Patent [19]
Pullen et al.

[11] Patent Number: 5,644,103
[45] Date of Patent: Jul. 1, 1997

[54] PACKAGING ELECTRICAL COMPONENTS HAVING A SCALLOP FORMED IN AN EDGE OF A CIRCUIT BOARD

[75] Inventors: Stephen R. Pullen, Derry, N.H.; Walter R. Hedlund, III, Lowell, Mass.

[73] Assignee: VLT Corporation, San Antonio, Tex.

[21] Appl. No.: 337,245

[22] Filed: Nov. 10, 1994

[51] Int. Cl.$^6$ .............................. H05K 5/00; H05K 1/14
[52] U.S. Cl. .................... 174/52.1; 361/736; 361/743; 29/860; 29/878
[58] Field of Search ........................ 174/52.1, 250, 174/261; 361/728, 736, 743, 748, 760–764, 767, 820; 257/690, 692; 29/860, 877–879

[56] References Cited

U.S. PATENT DOCUMENTS

| | | | |
|---|---|---|---|
| 3,621,338 | 11/1971 | Rogers et al. . | |
| 3,683,241 | 8/1972 | Duncan . | |
| 3,737,729 | 6/1973 | Carney | 361/395 |
| 3,805,117 | 4/1974 | Hausman | 317/101 CP |
| 4,218,724 | 8/1980 | Kaufman | 361/395 |
| 4,400,762 | 8/1983 | Bartley et al. . | |
| 4,417,296 | 11/1983 | Shelhorn . | |
| 4,531,145 | 7/1985 | Wiech, Jr. . | |
| 4,551,746 | 11/1985 | Gilbert et al. . | |
| 4,551,747 | 11/1985 | Gilbert et al. . | |
| 4,554,613 | 11/1985 | Kaufman | 361/386 |
| 4,724,283 | 2/1988 | Shimada et al. . | |
| 4,740,414 | 4/1988 | Shaheen . | |
| 4,750,089 | 6/1988 | Derryberry et al. . | |
| 4,769,525 | 9/1988 | Leatham . | |
| 4,783,695 | 11/1988 | Eichelberger et al. . | |
| 4,783,697 | 11/1988 | Benenati et al. . | |
| 4,840,286 | 6/1989 | Heberling et al. | 361/395 |
| 4,847,136 | 7/1989 | Lo . | |
| 4,872,081 | 10/1989 | Murphy et al. | 361/395 |
| 4,879,630 | 11/1989 | Boucard et al. . | |
| 4,899,257 | 2/1990 | Yamamoto | 220/306 |
| 4,918,811 | 4/1990 | Eichelberger et al. . | |
| 4,953,005 | 8/1990 | Carlson et al. . | |
| 4,994,215 | 2/1991 | Wiech, Jr. . | |
| 5,001,603 | 3/1991 | Villaneuva, III et al. | 361/394 |
| 5,006,673 | 4/1991 | Freyman et al. . | |
| 5,019,941 | 5/1991 | Craft . | |
| 5,019,946 | 5/1991 | Eichelberger et al. . | |
| 5,028,987 | 7/1991 | Neugebauer et al. . | |
| 5,111,362 | 5/1992 | Flamm et al. | 361/395 |
| 5,159,433 | 10/1992 | Kazami et al. | 357/75 |
| 5,258,888 | 11/1993 | Korinsky | 361/704 |

FOREIGN PATENT DOCUMENTS

| | | |
|---|---|---|
| 0141582 | 5/1985 | European Pat. Off. . |
| 3323604 | 1/1985 | Germany . |
| 04287396 | 10/1992 | Japan . |
| 2248345 | 1/1992 | United Kingdom . |
| 9403038 | 3/1994 | WIPO ........................ H05K 7/20 |

OTHER PUBLICATIONS

"Flexible Applique Attachment for SMT Resistors and Capacitors", IBM Technical Disclosure Bulletin, vol. 34, No. 12, May 1, 1992, pp. 207–208.

Nickols et al., "Fabricating Charge Plate Conductor and Charge Tunnel", IBM Technical Disclosure Bulletin, vol. 19, No. 12, May 1977, p. 4752.

Gates and Yokoro; "Sealed Chip–On–Board Circuit Protection", 3rd International SAMPE Electronics Conference; Jun. 20–22, 1989; pp. 929–938.

*Primary Examiner*—Bot L. Ledynh
*Attorney, Agent, or Firm*—Fish & Richardson P.C.

[57] ABSTRACT

A structure includes a baseplate, a circuit board parallel and adjacent to the baseplate, and an electronic component. The circuit board has an edge with a scallop formed in the edge, and the scallop is plated with a conductive material. The electronic component includes a power-dissipating surface and a pad for making electrical connection. The electronic component is mounted with the power-dissipating surface in contact with the baseplate and the pad electrically connected to the conductive material.

15 Claims, 18 Drawing Sheets

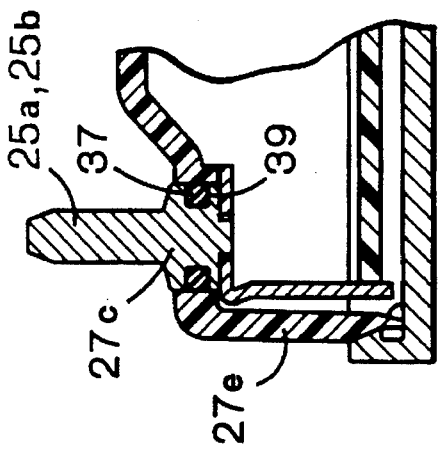
FIG. 2D
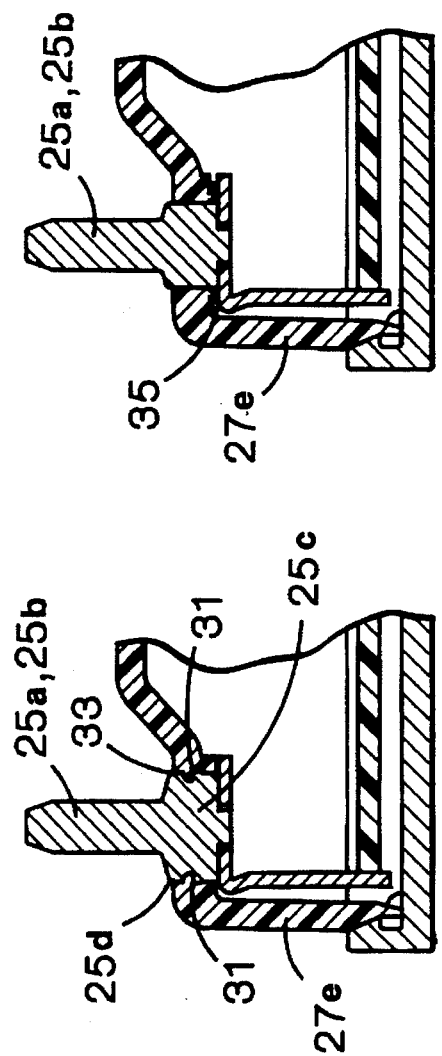
FIG. 2C
FIG. 2B
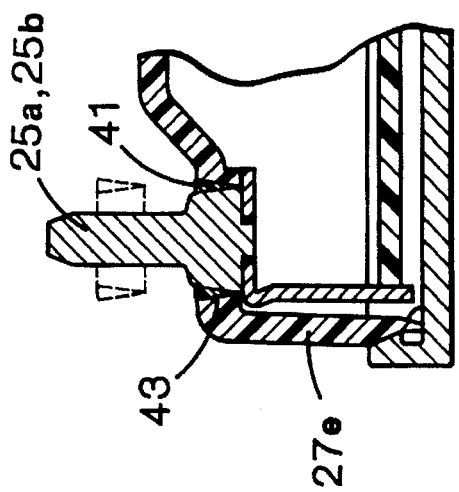
FIG. 2F
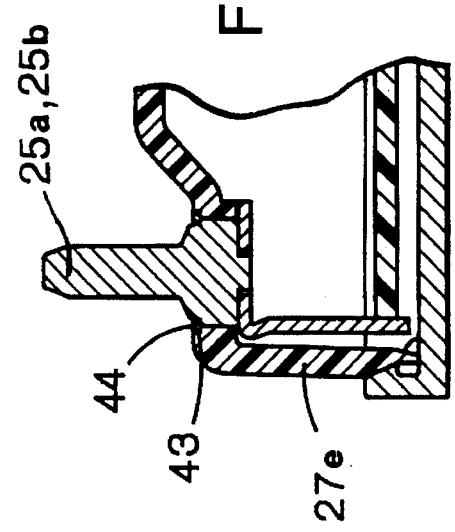
FIG. 2E

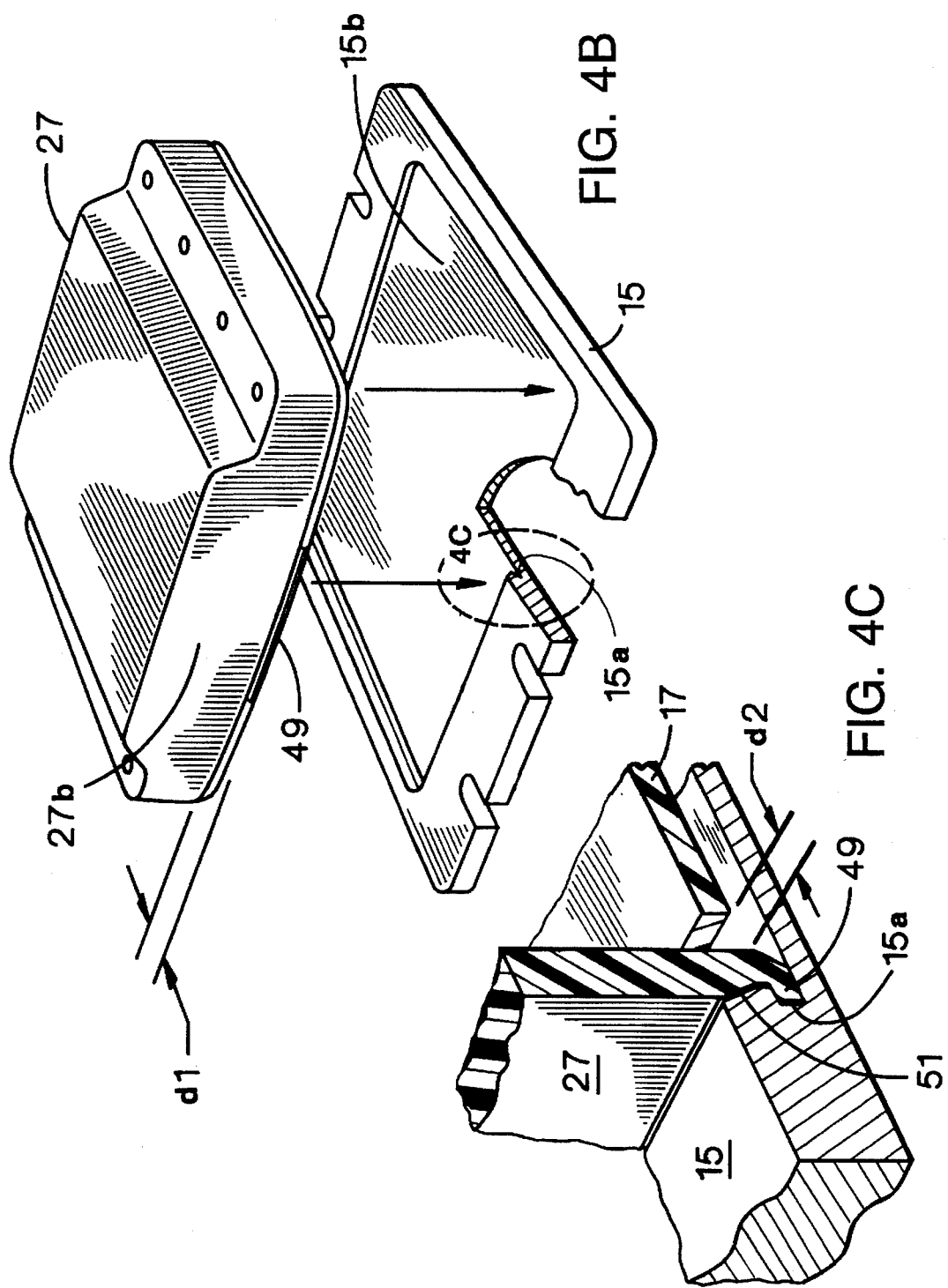

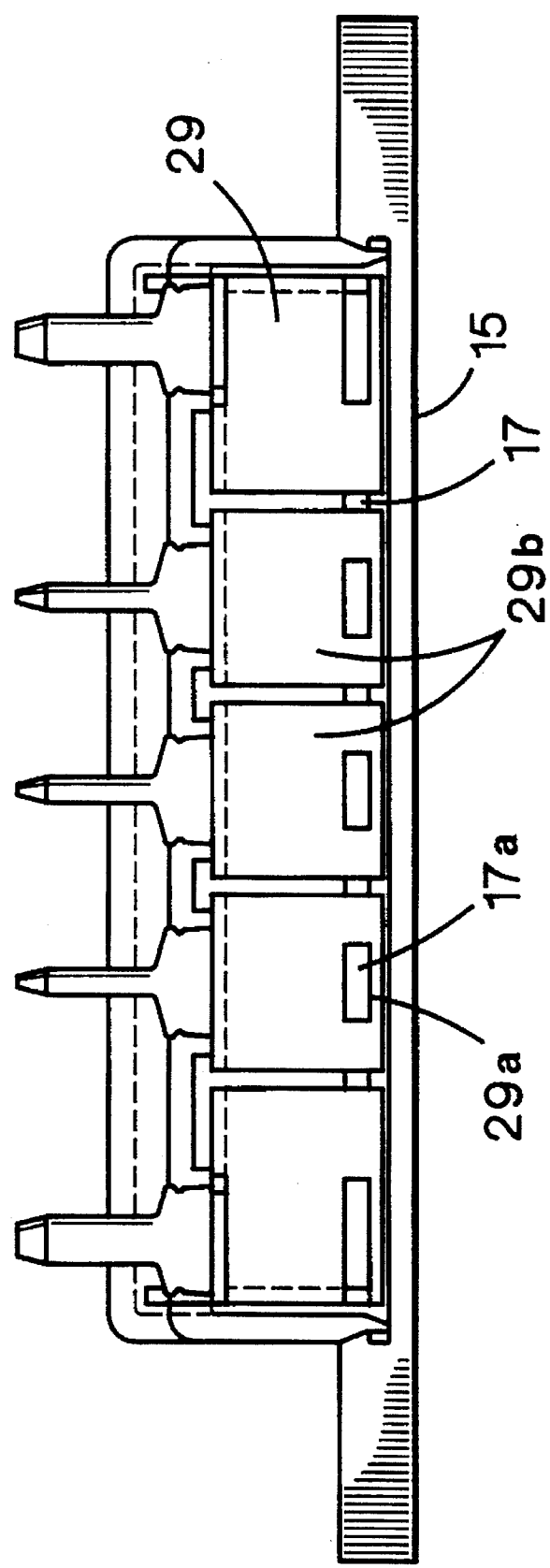

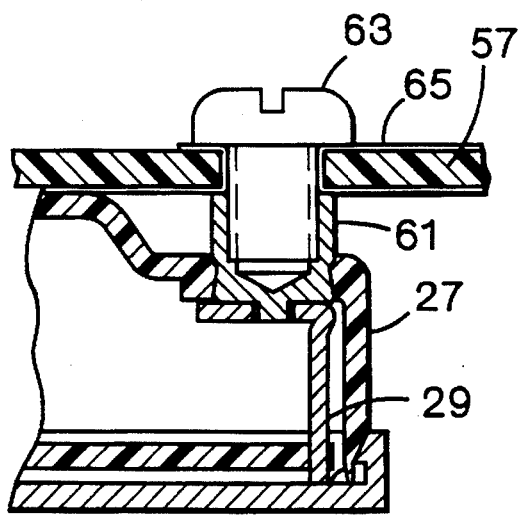
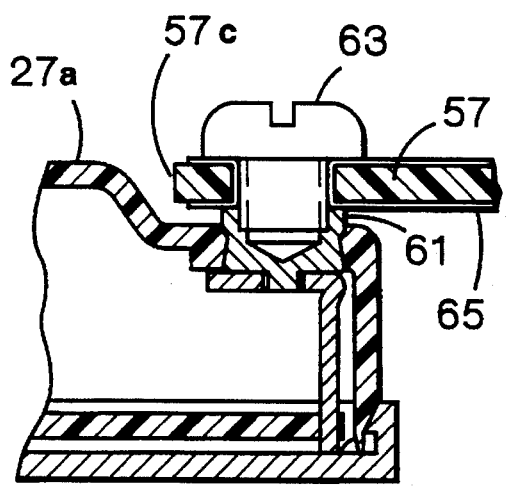
FIG. 8A    FIG. 8B
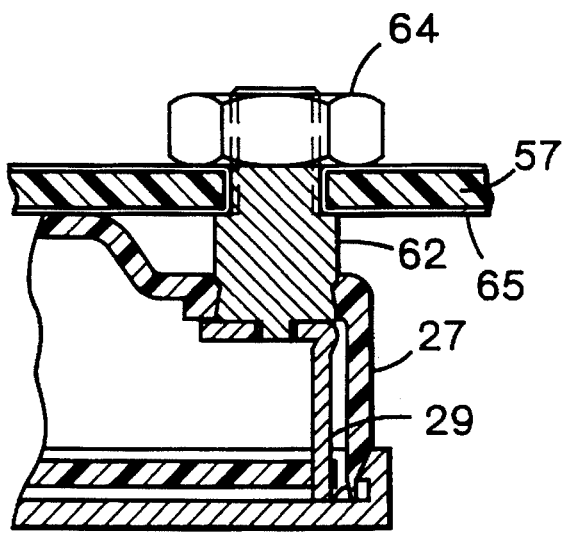
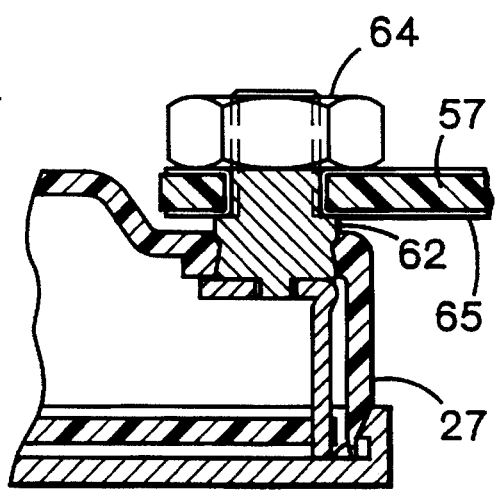
FIG. 8C    FIG. 8D

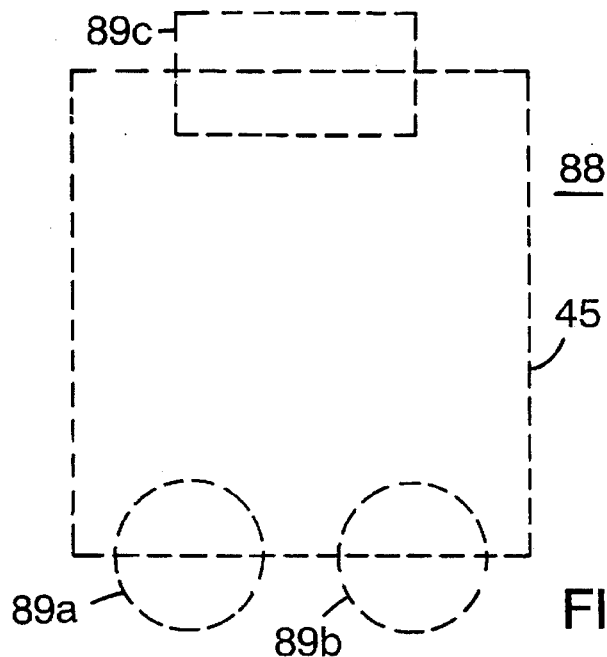
FIG. 15
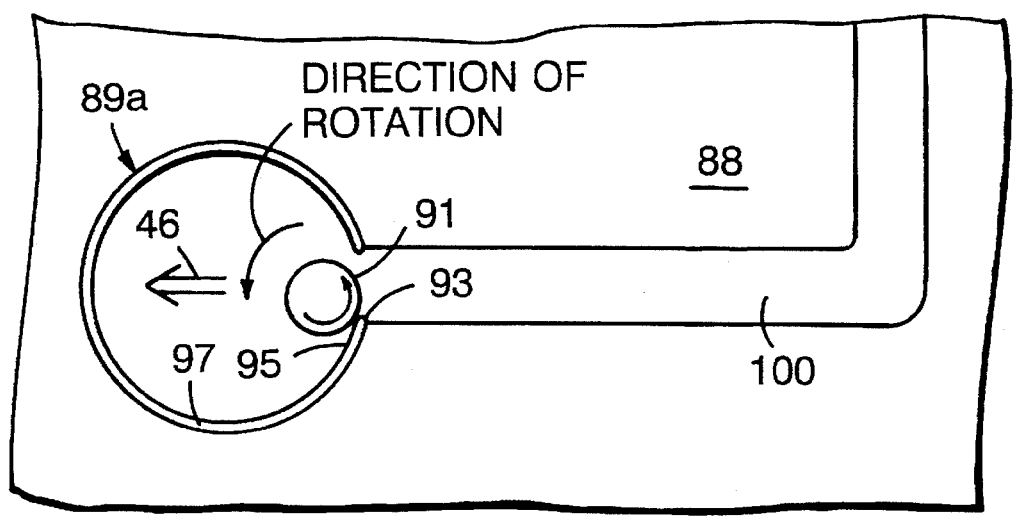
FIG. 16
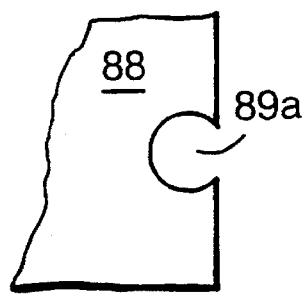 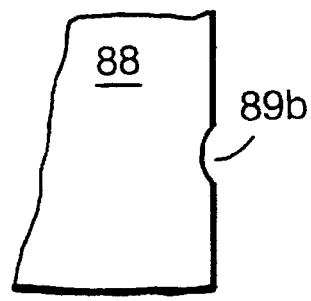 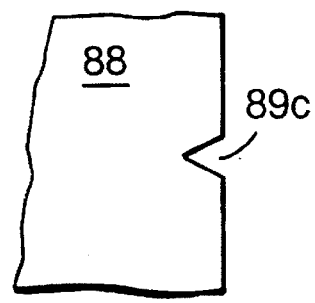
FIG. 17A  FIG. 17B  FIG. 17C

PACKAGING ELECTRICAL COMPONENTS HAVING A SCALLOP FORMED IN AN EDGE OF A CIRCUIT BOARD

BACKGROUND OF THE INVENTION

This invention relates to packaging electrical components.

One approach to packaging electrical components (FIG. 1) includes a housing which both encloses the components and aids in the removal of heat from power dissipating components within the housing. The housing includes a non-conductive casing 5 and an aluminum heat-sinking base 6. A printed circuit board (PCB) 3 is mounted next to the upper wall 5a of the casing. Conductive pins 7 are attached directly to the PCB 3 and extend up through wall 5a. Electronic components 9a, 9c are mounted to one or both sides of the PCB 3 (upper side 3a and lower side 3b). Larger components such as inductor 9c are mounted to the lower side 3b for space reasons. Power-dissipating components 9b are mounted directly to the baseplate 6 for better heat transfer. Component 9b is electrically connected to the PCB by leads 12.

The pins 7 allow assembly 1 to be mounted to a circuit board 14; the baseplate 6 provides a flat, thermally conductive surface from which heat generated within the assembly may be removed by free or forced convection or by mounting a heat sink (not shown) to the surface of the baseplate.

Assembly 1 is filled with an epoxy encapsulant which becomes relatively rigid upon curing. The encapsulant acts as a thermal spreader and provides mechanical support. To assure that the case and base are held together tightly, a pocket 6a is formed in the baseplate with undercuts 6b formed along the edge of the pocket. The encapsulant extends into the undercuts and has enough tensile strength to minimize the chances of the case being pulled away from the base. To protect the components from damage by shrinkage of the stiff encapsulant which may occur during curing or exposure to low temperatures, sensitive components (e.g., glass diodes, ceramic resistors or capacitors, magnetic cores) are covered with a "buffer coating" of a soft, rubbery material.

SUMMARY OF THE INVENTION

In general, in one aspect, the invention relates to a structure having a baseplate, a circuit board parallel and adjacent to the baseplate, and an electronic component. The circuit board has an edge with a scallop formed in it, and the scallop is plated with a conductive material. The electronic component has a power-dissipating surface and a pad for making electrical connection. The electronic component is mounted with the power-dissipating surface in contact with the baseplate and the pad electrically connected to the conductive material.

Embodiments of the invention include the following features. The edge in which the scallop is formed may be in an aperture of the board. The electronic component may include a device that sits in the aperture. The scallop may comprise a recess having an edge which is a fraction of a cylinder or a recess having a slot-shaped edge. Solder may connect the pad to the scallop, and the solder may form a fillet between the pad and the scallop. The conductive material on the scallop may be metal.

In general, in another aspect, the invention relates to a structure having a baseplate, a circuit board parallel and adjacent to the baseplate, and an electronic component. The circuit board has an edge with a metal-plated scallop formed in the edge, the scallop comprising a recess having an edge which is a fraction of a cylinder. The electronic component includes a power-dissipating surface and a pad for making electrical connection. The electronic component is mounted with the power-dissipating surface in contact with the baseplate and the pad electrically connected to the metal-plated scallop by a fillet of hardened solder.

In general, in another aspect, the invention relates to a method for mounting a power-dissipating component having a contact pad. The component is mounted on a baseplate, and a circuit board having an aperture is placed over the component with at least part of the power-dissipating component lying in the aperture. The pad is soldered to a plated scallop formed in an edge of the aperture.

Embodiments of the invention include the following features. The scallop may be formed in the edge of the aperture by forming a hole in the circuit board, applying the conductive material to an inner wall of the hole, and routing the aperture into the circuit board such that the aperture consumes a portion of the hole, the portion of the hole not consumed by the aperture forming the scallop. The scallop may comprise a recess having an edge which is a fraction of a cylinder or a recess having a slot-shaped edge. The conductive material may be metal. Soldering the pad to the scallop may include forming a fillet of hardened solder between the pad and the scallop.

Advantages of the invention include the following. Strong mechanical bonds are formed between circuit boards and electronic components. Manual inspection and automatic inspection of bonds between circuit boards and electronic components are facilitated. When solder forms the connections between circuit boards and electronic components, the application of solder paste is facilitated.

A variety of other advantages and features will become apparent from the following description and from the claims.

DESCRIPTION

FIGS. 2b–2f are side sectional views of alternate pin/case structures.

FIG. 4b is an exploded perspective cutaway view of the case and baseplate.

FIG. 4c is a side sectional view, enlarged of a portion of FIG. 4b.

FIG. 5a is an end view, partially broken away, of the packaging of FIG. 3.

FIGS. 8a–8d are sectional side views of alternate mounting pin structures.

FIGS. 15 and 16 are enlarged top views of stages in forming scallops.

FIGS. 17a, 17b and 17c are top views of scallops with alternative shapes.

Figure 2A:
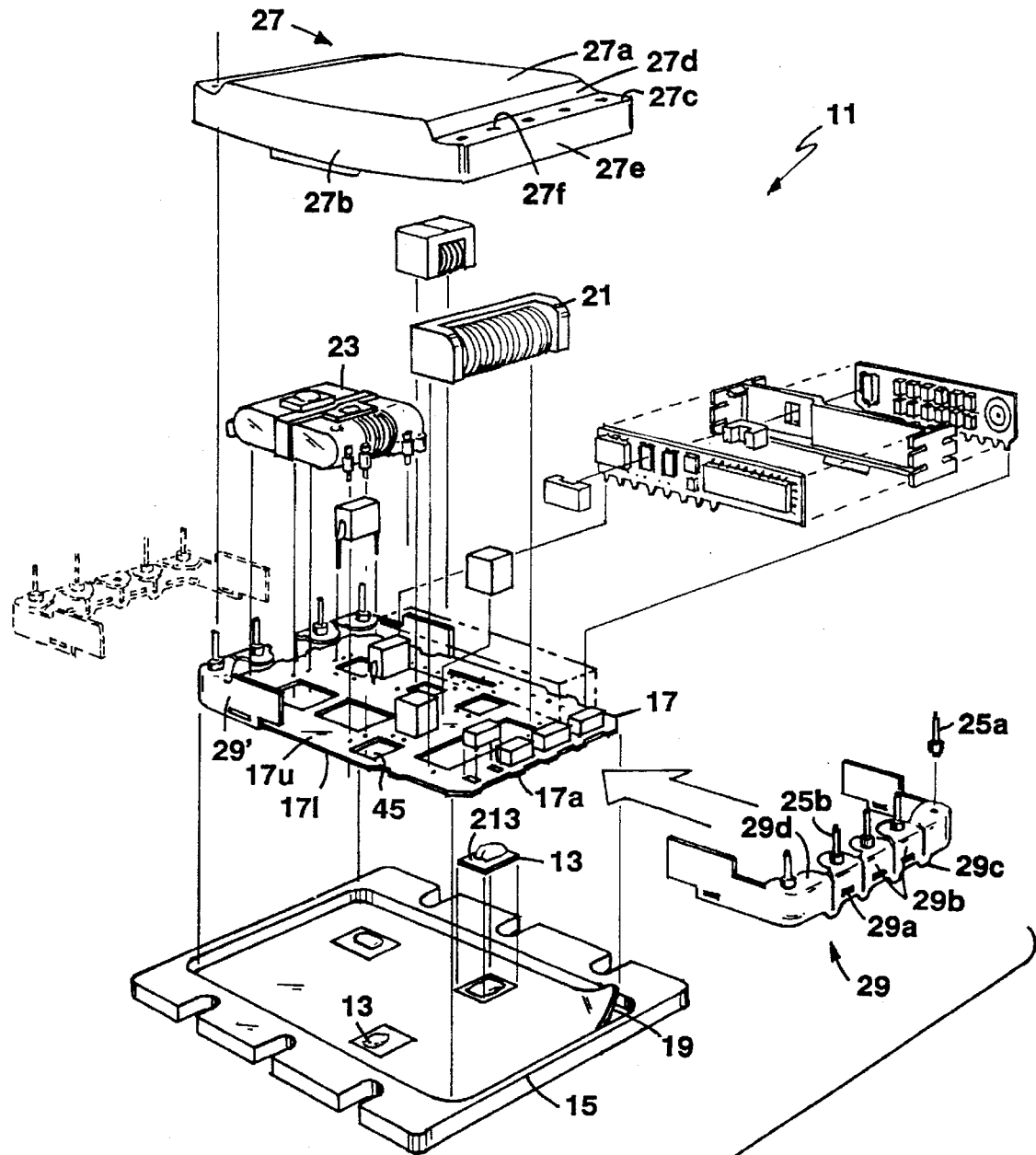
FIG. 2a is a perspective exploded view of component packaging according to the invention.

Referring to FIG. 2a, in the packaging 11 provided by this invention, a power-dissipating electronic component 13 is mounted directly on a thermally conductive (e.g., aluminum) baseplate 15. A multilayer printed circuit board (PCB) 17 is placed over the power-dissipating component and electrical connections are made directly between component 13 and the PCB. The power-dissipating component 13 includes a substrate 213. The thickness of substrate 213 defines a gap between lower side 17L of the PCB and the baseplate 15. An insulating sheet 19 is placed in that gap. Upper side 17U of the PCB is used to mount components (e.g., inductor 21, transformer 23) which then fit within the space between upper side 17U and the upper wall of the case. Low-profile components such as SMD resistors may also be mounted on lower side 17L of the PCB.

Figure 1:
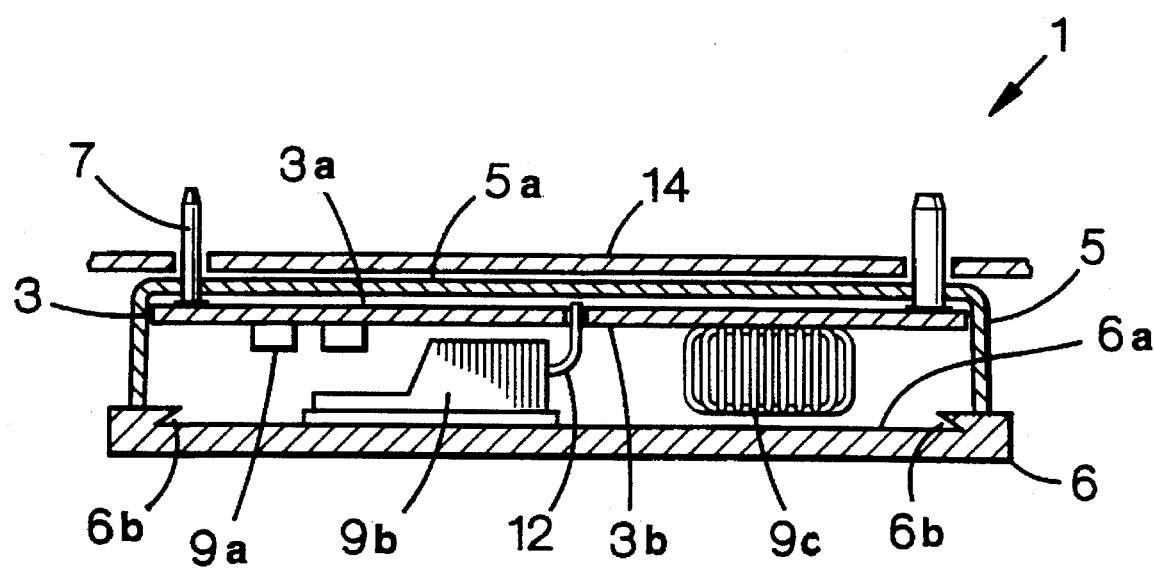
FIG. 1 is a cross-sectional side view of prior art component packaging.

The power-dissipating component is mounted directly to both the baseplate 15 and the PCB 17. Accordingly, thermal resistance between the power-dissipating component and the baseplate is low, while the need for connecting leads (leads 12 in FIG. 1) is eliminated. Elimination of the leads simplifies manufacture because proper placement and soldering of the leads is difficult. Also, the leads exhibit parasitic inductance and resistance which, in high frequency circuits (e.g., above 500 KHz), contribute to undesirable side effects during circuit operation, e.g., slowing of rise times and introduction of high-frequency oscillatory ringing.

Connections from pins 25a and 25b to the PCB 17 are made via conductive links which are initially formed as fences 29, 29'. Fences 29, 29' are mounted along two of the edges of the PCB and wrap around the corners of the PCB. The links then project up toward the upper wall of the case in a direction perpendicular to the PCB. The fences have slots 29a which mate with tongues 17a formed along the edges of the PCB. The links 29b (see also FIG. 5a) are initially connected by severable portions 29c, which are clipped away during manufacture.

Each fence link has a portion 29d that is bent at right angles to the main part of the link. Each portion 29d corresponds to one of the pins 25a–25b. The bent portions 29d extend parallel to the PCB, thus giving the fence an inverted L-shape in cross-section. Pins 25a–25b are connected to bent portions 29d, thus leaving the space between the bottoms of the pins and the PCB available for circuit components. In the example of a power converter circuit, large pins 25a are used at the corners of the board for power connections; smaller pins 25b are used for control terminals. The relative sizes of the pins can be adjusted according to the power and control requirements of the power converter. The bottom of each link is soldered to a corresponding run on the PCB.

The breadth of the interconnection path between the link and the run is greater for the power links at the corners of the board than for the control links. This broader interconnection path provides a greater current carrying capacity. This is especially useful, for example, in the context of packaging a DC—DC power converter (e.g., where PCB 17 may be a four-layer board approximately 1.5 inches in width, 2.2 inches in length and 0.030 inches thick). Such a converter may deliver 30 Amps of current to a load via the converter output pins (pins 25a). However, the thickness of the traces on the four layers of the PCB is a small fraction of the total thickness of the PCB. Without the broad and relatively thick links of the fence, it would be necessary to devote a large amount of trace area on the PCB to carry the large current. Use of the fence links obviates this problem as the full thickness of the fence (e.g., 0.030 inch) is available for carrying current. As a result, the amount of trace area on the surface of the board dedicated to carrying large currents can be minimized. Also the fence links reduce the impedance of the path which carries the current.

The fence links also assure that the electrical connections between the links and the PCB are close to the source of current. For example, the protrusions (e.g., ridges) 17a along the edge of the PCB may be placed at locations which are close to the source of current (e.g., one or more of the connecting pins on the transformer 23 or inductor 21). Thus, the substantial current-carrying capacity of the fence links may be used to advantage starting at a point along the edge of the PCB which is physically close to the source of the current, thus minimizing output impedance and losses associated with flow of current from internal circuitry to the output pins of the converter.

Once the baseplate 15, PCB 17 with mounted components, fences 29, 29', and pins 25a–25b have been assembled, a case 27 is attached to the baseplate. Case 27 is molded of a thermoplastic material (e.g., Valox or Ultem) and is generally cup-shaped. The case includes an upper wall 27a, sloped transitions 27d connecting the upper wall with steps 27c, side walls 27b, and end walls 27e. A row of holes 27f for the pins is arranged along each of the steps 27c.

To prevent leakage of liquid encapsulating material (prior to curing) the pins 25a–25b are sealed to the case. In one scheme (FIG. 2b), a sharp ridge 31 is formed on a base 25c of a pin 25. The holes (e.g., 27f in FIG. 2A) are small enough to assure a friction seal between the pins and the case. In FIG. 2b, the pin is pulled through the hole, causing the relatively large diameter upper shoulder 25d of the pin to stretch the inside diameter of the corresponding hole. The shoulder of the pin then snaps into a groove 33 surrounding the outer edge of the aperture, causing the sharp serrations 31 to bite into the inner walls of the plastic case material to form a seal.

Other schemes are possible. In FIG. 2c, a membrane 35 is placed over the pins 25a–25b before the pins are pushed through the holes in the case 27. In FIG. 2d, a compliant O-ring 37 is seated in a groove 39 formed in the base 25c of the pin. In FIGS. 2e and 2f, a thermoplastic washer 41 is placed in a recess 43 formed between the pin and the hole. The ring-shaped thermoplastic washer 41 can be flat (FIG. 2e) or beveled (FIG. 2f). Heat is applied in the vicinity of the washer causing the plastic to soften to create a seal. All of the schemes in FIGS. 2b–2f may be used with both small diameter and large diameter pins.

Figure 3:
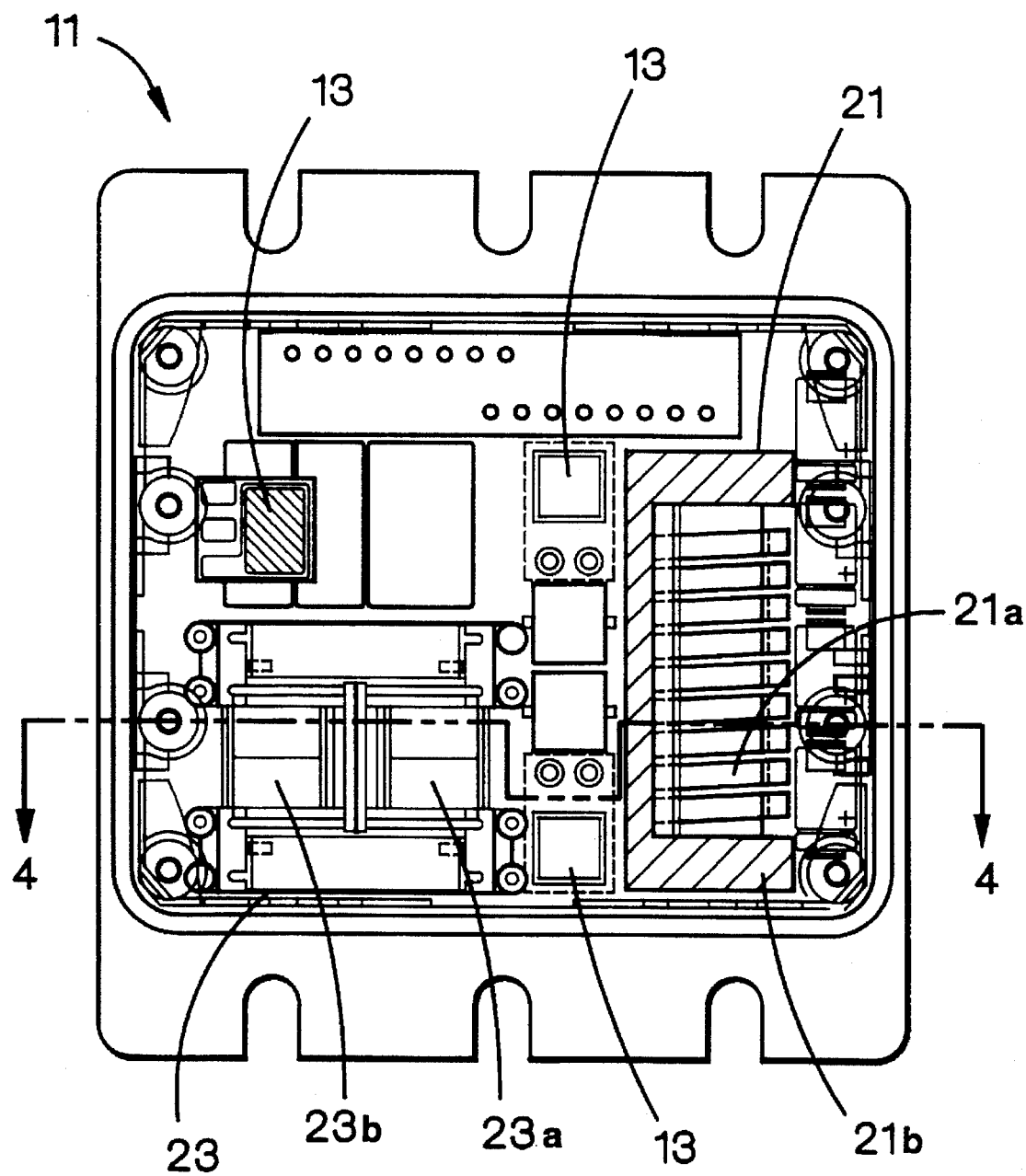
FIG. 3 is a top view of the packaging with the case removed.
Figure 4A:
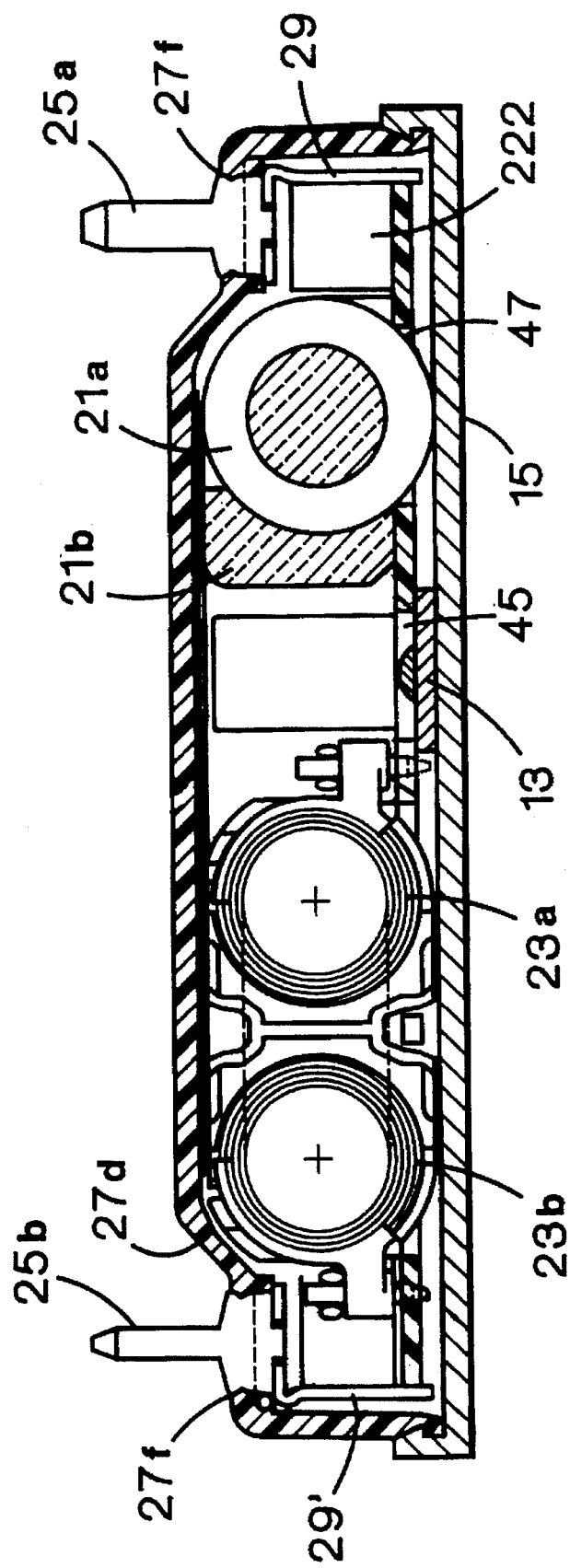
FIG. 4a is a side sectional view of the packaging of FIG. 3 taken along lines IV—IV.

As seen in FIGS. 3 and 4a, in the case of a power converter, the components being packaged include power-dissipating components 13 and large components such as an inductor 21 and a transformer 23. The inductor 21 may have a winding 21a and a ferrite core 21b. The transformer 23 may have two windings 23a, 23b. In FIG. 4a, (see also FIG. 2a) holes 45 in the PCB 17 are positioned over power-dissipating components 13 which have been previously mounted directly to the baseplate 15. When the PCB is mounted on the baseplate 15, fences 29 and 29', with pins 25a–25b attached, have already been assembled to the PCB, and the severable parts of the fence have already been severed. Once the PCB is in place, the case 27 is mounted over the pins with the pins extending through holes 27. The large components such as inductor 21 and transformer 23 are located on the PCB in the space beneath the sloped transitions 27d. Space is further conserved by mounting the inductor 21 and the transformer 23 on the PCB 17 so that windings 23a, 23b of the transformer and winding 21a of the inductor extend partially through holes 47 formed in the PCB. This mounting arrangement allows part of the bodies of windings 21a and 23a–b to occupy the same vertical clearance as the thickness of PCB 17, thus allowing the overall thickness of the packaging to be reduced. At the same time, the windings are effectively cooled by minimizing the thermal impedance between the windings and the baseplate.

Other smaller components 222 are mounted beneath the pins and take advantage of space near the edges of the PCB which would not otherwise be available if the fence links were not provided in place of longer pins running directly to the PCB.

For the purpose of attaching case 27 to the baseplate 15 (see FIGS. 4b and 4c), teeth 49 are formed along the lower edge of at least the two side walls 27b of the case (only one tooth is shown). A matching groove (or detent) 15a is undercut along the edge of pocket 15b. A portion of PCB 17 is also shown in FIG. 4c. As the case is brought down over the pocket, the side walls 27b of the case are urged inward due to contact between the teeth 49 and angled surfaces 51 formed on the baseplate. The angled surfaces 51 lead the teeth 49 into the grooves 15a. Once the teeth 49 are locked into grooves 15a, the case 27 cannot be removed without pressing in on side walls 27b of the case. To ensure a snug fit between the case and sloped surface 51 of the baseplate, a small amount of outward curvature d1 (exaggerated in FIG. 4b) is provided along the side walls of the case, thus prebiasing the case.

The "snap in" structure shown in FIGS. 4b and 4c allows the use of a soft encapsulant, and thus eliminates the need for a buffer coating on components within the package. The encapsulant in FIGS. 4a and 4b need only have low compressibility, so as to resist any compressive forces which might tend to squeeze the side walls of the case together. As long as those side walls cannot be squeezed together, the case cannot be pulled away from the baseplate. The incompressibility of the material filling the space d2 between the lower edge of side wall 27b of the case and the outer edge of the PCB 17 prevents the teeth from moving out of the groove 15a. The encapsulant thus forms part of a noncompressible span of encapsulating material and components extending between the places on the two side walls of the case where the teeth are located. At the same time, the injected material is sufficiently soft not to damage the components during expansion or contraction.

In the case of a DC—DC power converter containing magnetic components and surface mounted passive components and semiconductors, Mineral-filled, Two-component Epoxy system #LA4001-12, made by Emerson & Cuming, Woburn, Mass. 01880, has adequate compressive strength to keep the teeth 49 engaged within the groove 15a while providing enough resilience for operation over a temperature range of –40 C. to 100 C. and without the use of a buffer coating.

Referring to FIG. 5a, fence 29 is mounted on the edges of PCB 17 with the tongues 17a on the PCB projecting into the slots 29a. Each link 29b has its own slot and is supported by a tongue 29a.

Figure 5B:
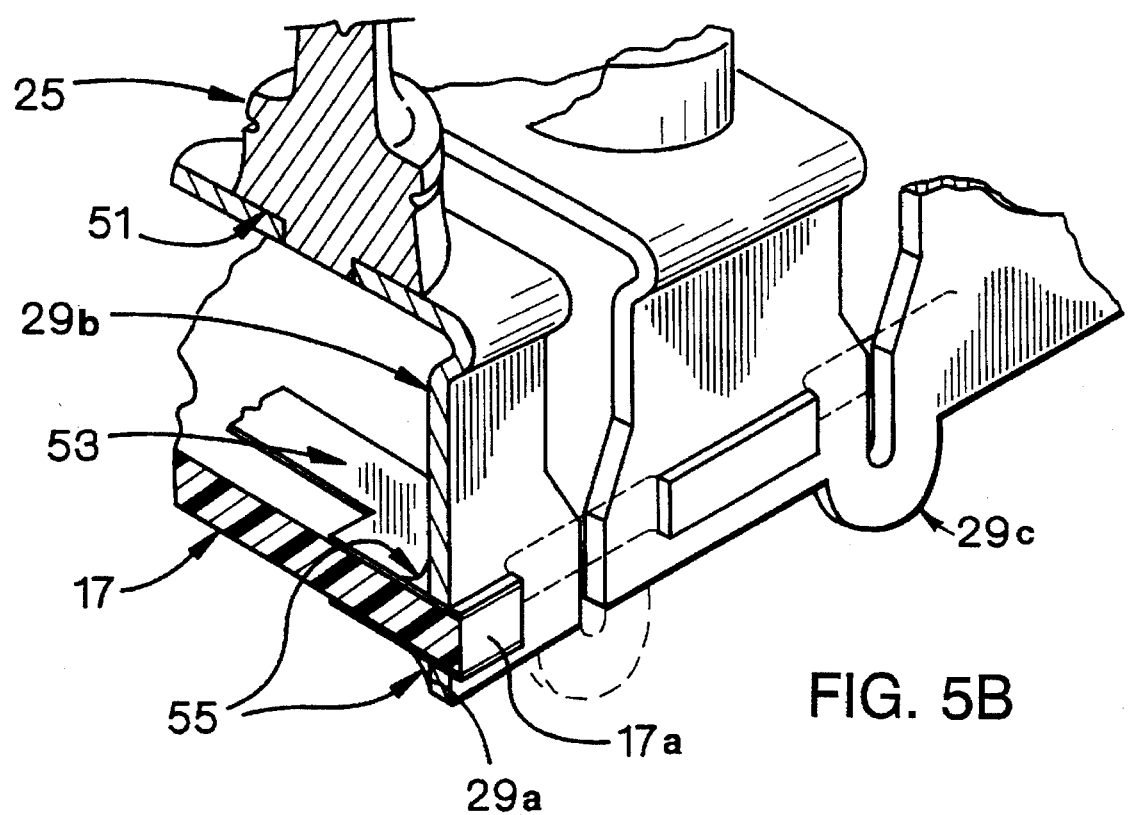
FIG. 5b is an exploded perspective cutaway view of a portion of the packaging of FIG. 3.

As shown in FIG. 5b, fence 29 is die cut from a thin sheet of copper in a pattern which includes the links, the slots, and the severable portions 29c connecting the links. Each pin 25 is soldered (51) to its corresponding link 29b. Conductive traces 53 on the PCB extend onto the tongues 17a. When the fence 29 is being attached to the PCB, traces 53 are electrically connected by soldering to the appropriate links and thus are connected to the appropriate pin 25. The solder also provides mechanical support of the fence to the PCB during the manufacturing process; the encapsulant subsequently provides more permanent support. The fence may be soldered to traces on either or both the upper and lower surfaces of the PCB.

After the fence is attached to the PCB, the severable portions 29c extend below the PCB. These severable portions are then cut (see phantom lines in FIG. 5b) to electrically separate the links 29b. Initially forming the links as interconnected fences effectively reduces the number of parts which need to be handled and attached to the PCB during assembly and ensures proper alignment of the links 29b.

Figure 6B:
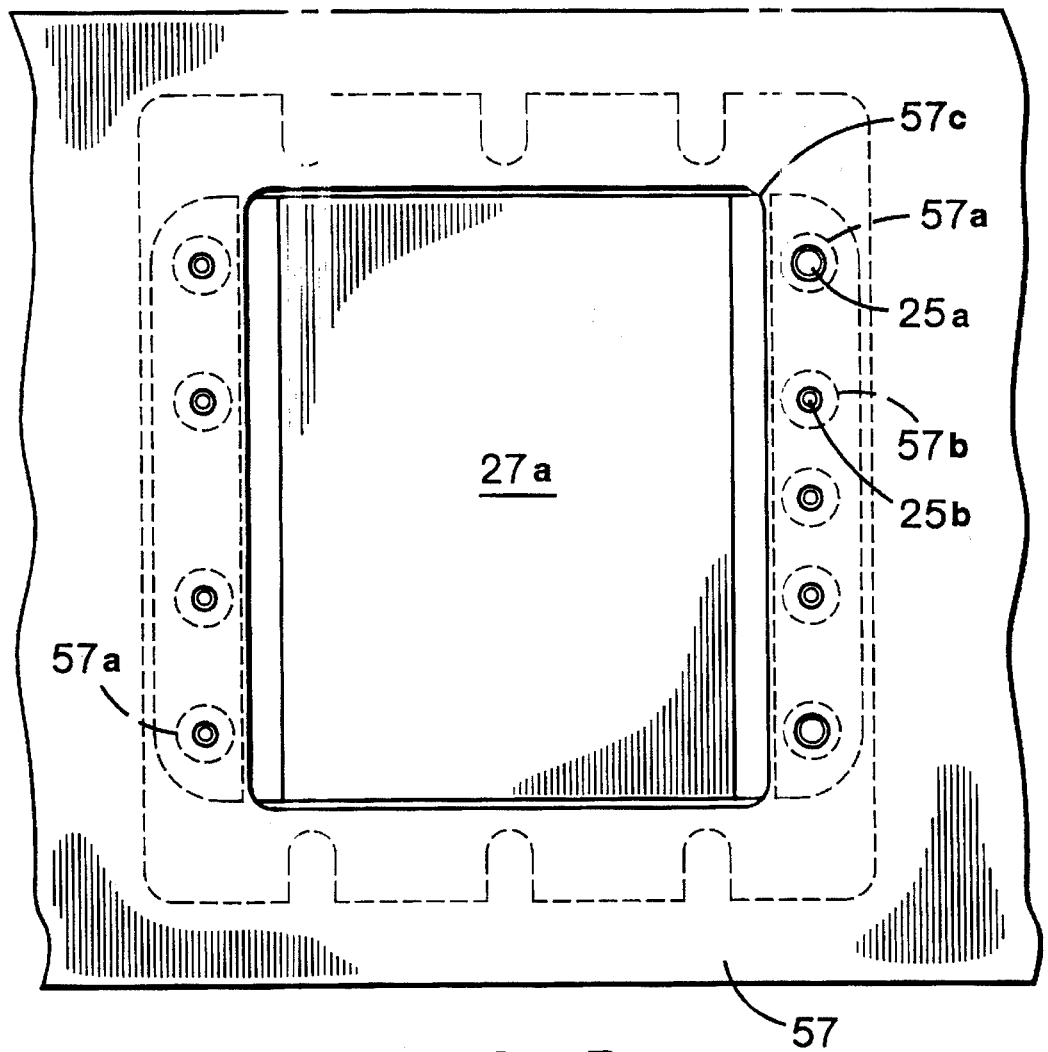
FIGS. 6a and 6b are side and top views, respectively, of the packaging of FIG. 3 mounted on a printed circuit board.
Figure 6A:
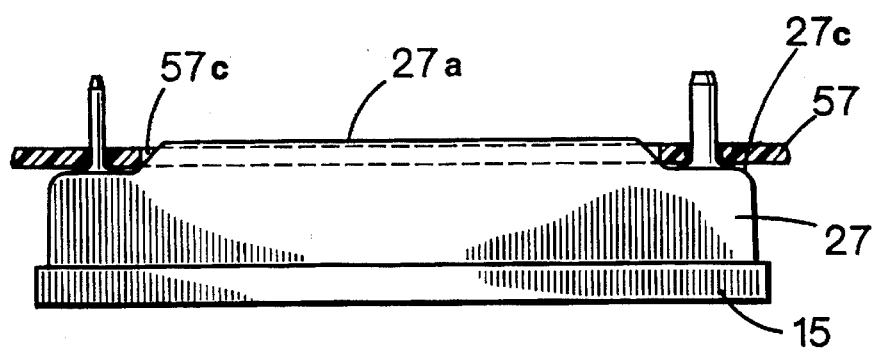

As shown in FIG. 6A, the steps on the case are useful in mounting the package to an external circuit board 57. As shown in FIG. 6B, circuit board 57 has holes 57a–57b corresponding to pins 25a–25b, and a distinct (i.e., separate from the pin holes) large rectangular hole 57c corresponding to the upper wall 27a of the case 27. The steps of the case allow the upper wall 27a to lie within hole 57c with the circuit board 57 resting on the steps. The effective height of the combined package and circuit board is reduced because a portion of the height of the package is coextensive with the thickness of the circuit board 57.

Figure 7B:
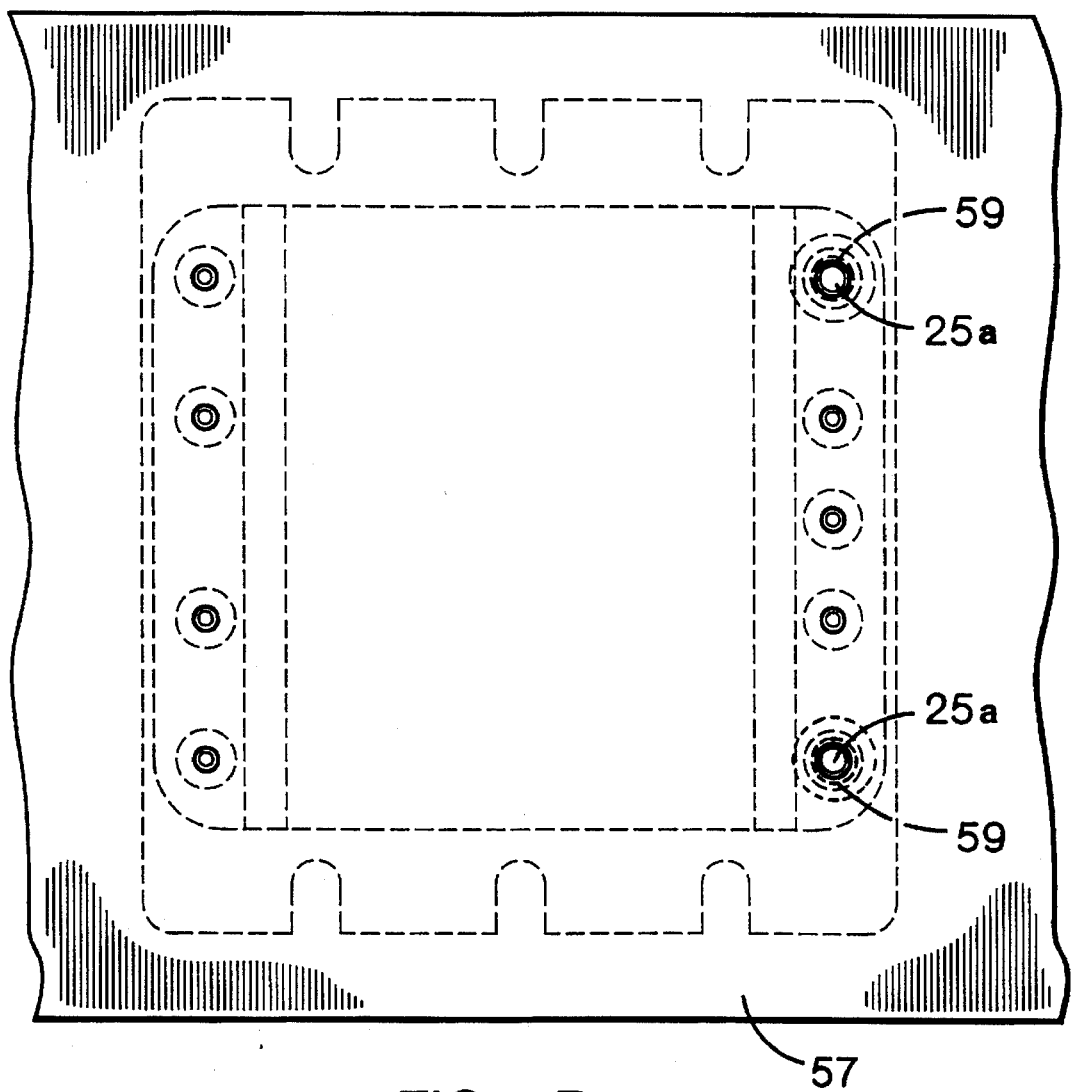
FIGS. 7a and 7b are side and top views, respectively, of another mounting technique.
Figure 7A:
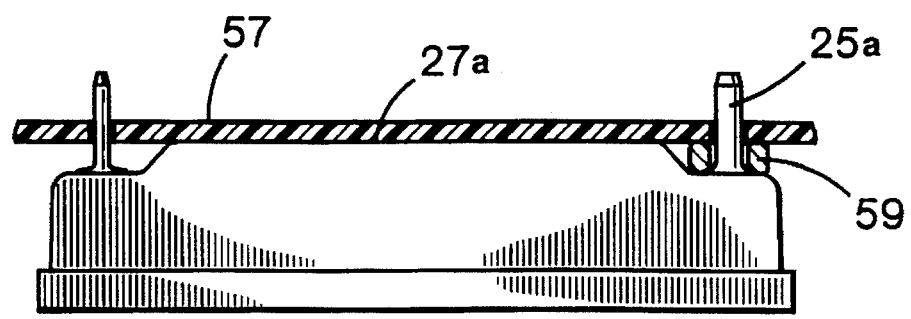

Alternatively, as shown in FIGS. 7a–7b, ferrite rings or "beads" 59 are placed on the pins 25a to reduce high-frequency noise. Circuit board 57 then fits flush against the upper wall 27a of the case, leaving a space for the ferrite rings 59.

In alternative pin structures, FIGS. 8a–8d, solder pins are replaced by male or females threaded pins, which permit higher current carrying capability and easier removal and remounting. The threaded schemes include either an internally threaded screw base 61 and a matching screw 63 or an externally threaded stud 62 and a corresponding nut 64. The screw base 61 (or stud 62) is connected to the fence link 29 and extends through the case 27 in the same manner as pins 25a–25b. No modifications are necessary to either the case 27 or the fence 29. Any of the alternative structures of FIGS. 2b–2f may be used with the threaded pins.

Circuit board 57 has circuit traces or conductive eyelets 65 in the vicinity of the rectangular hole for electrical connection with the screw 63 or nut 64 and the base 61 or stud 62 once the threaded assembly has been tightened. The resulting electrical connection between the fence link 29 and the circuit board 57 is ensured.

In FIG. 8a, the internally threaded screw base 61 is long enough to hold the upper wall 27a of the case flush against the circuit board 57. Screw 63 is attached from the rear of circuit board. In FIG. 8b, a shorter screw base 61 allows the upper wall 27a of the case to extend through hole 57c. FIGS. 8c–8d correspond to FIGS. 8a–8b with the base and screw replaced with stud 62 and nut 64.

Figure 9:
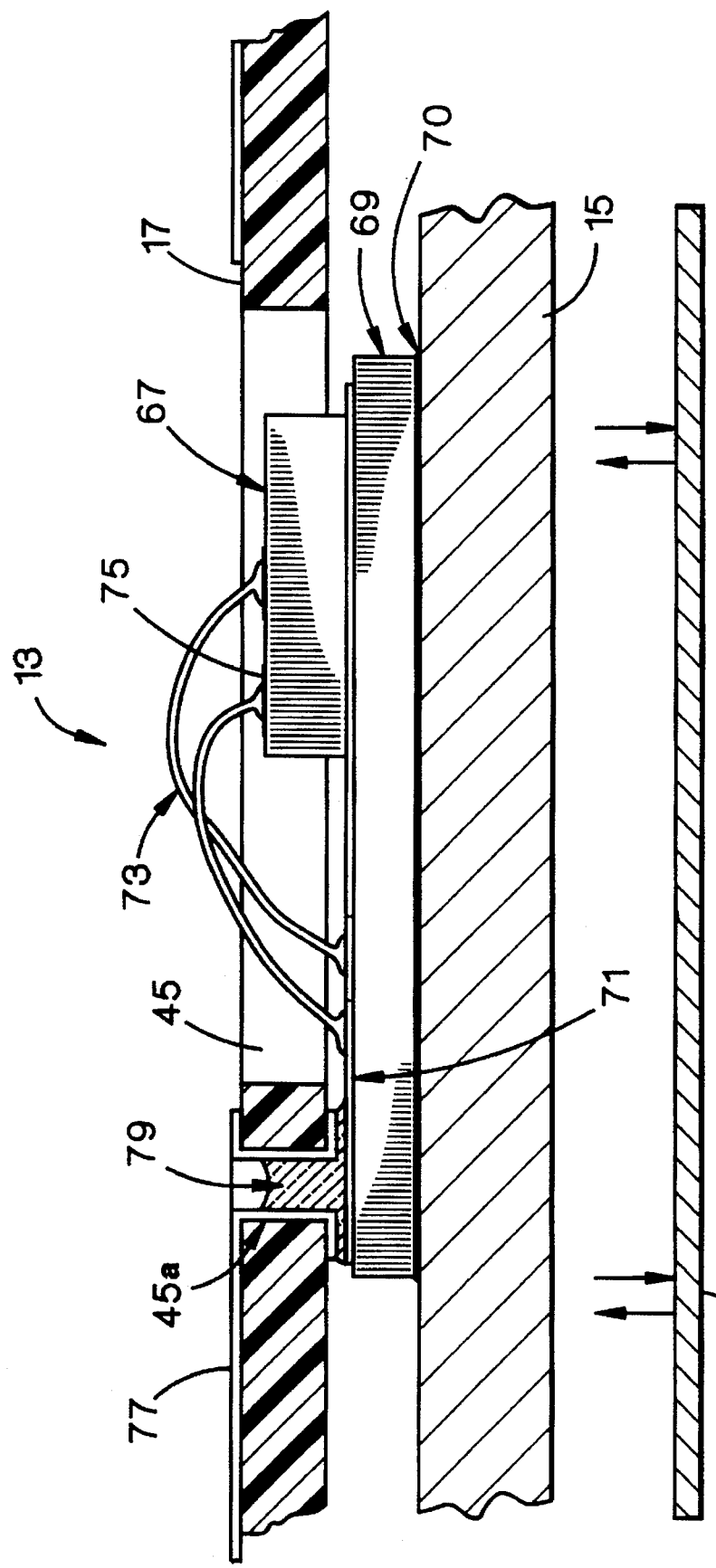
FIG. 9 is an enlarged side sectional view which illustrates how a power-dissipating component is mounted in the packaging.
Figure 10:
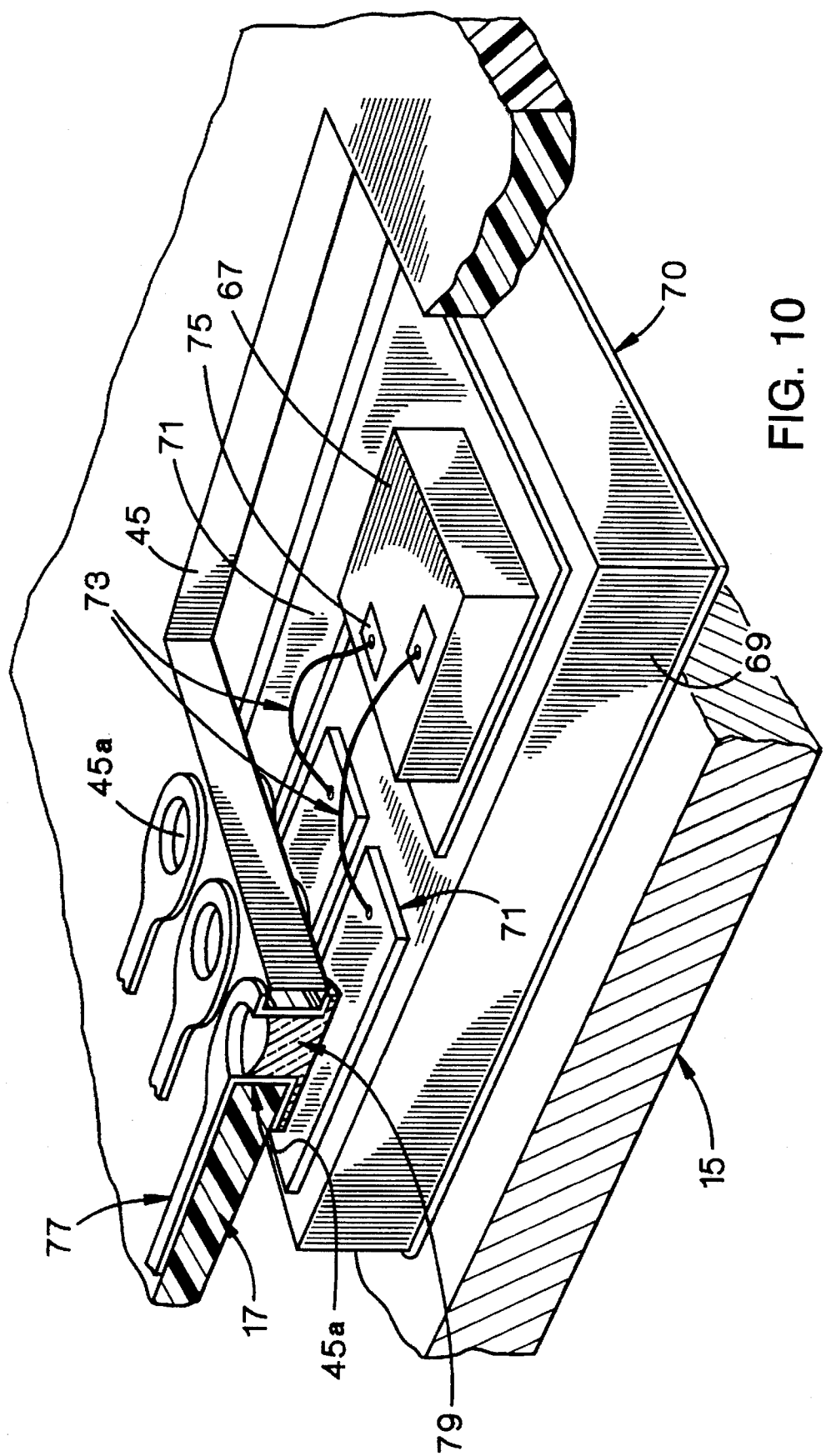
FIGS. 10 and 11 are enlarged perspective views, partially broken away, of a power-dissipating component mounted in the packaging.
Figure 11:
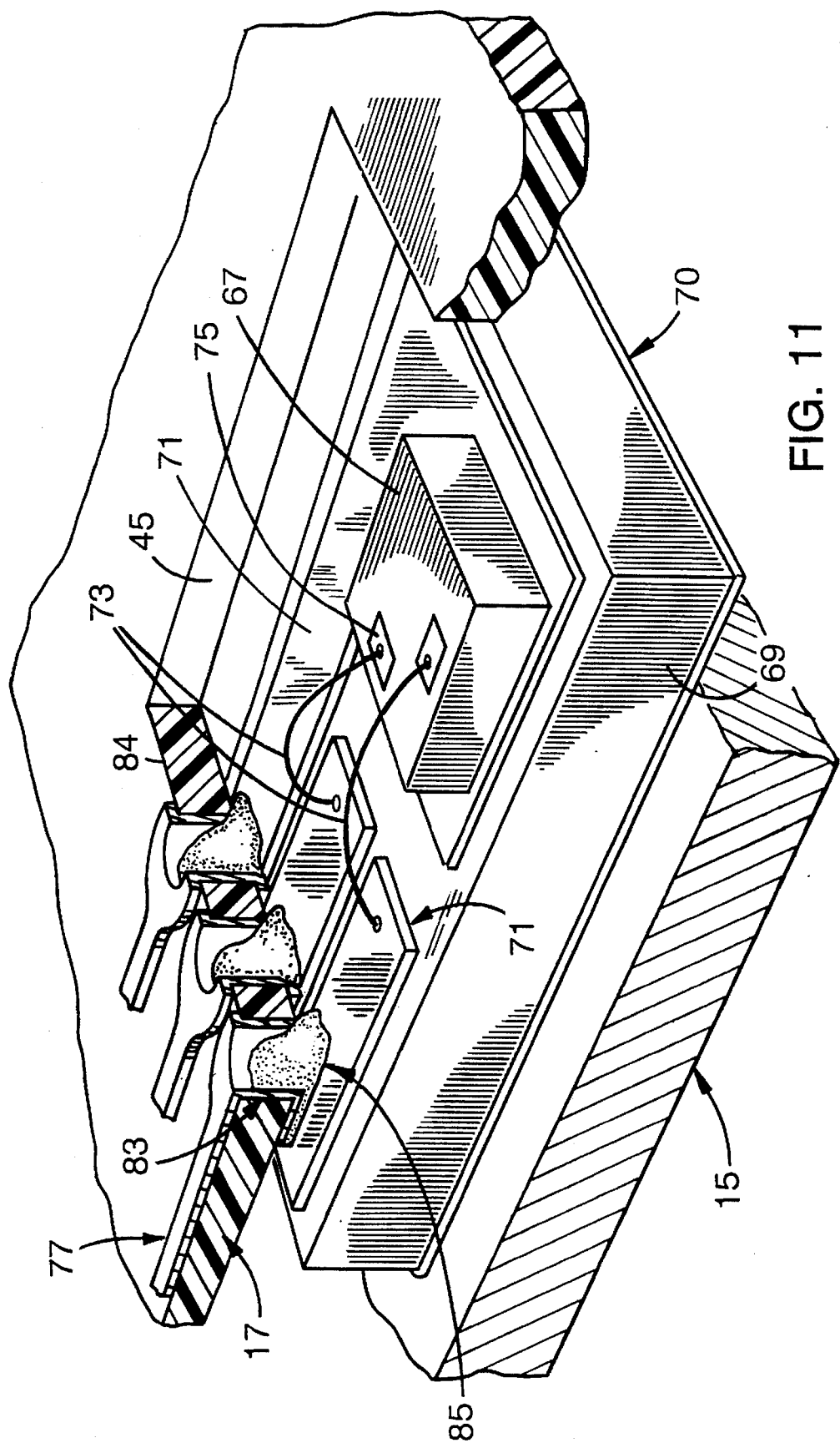
Figure 12:
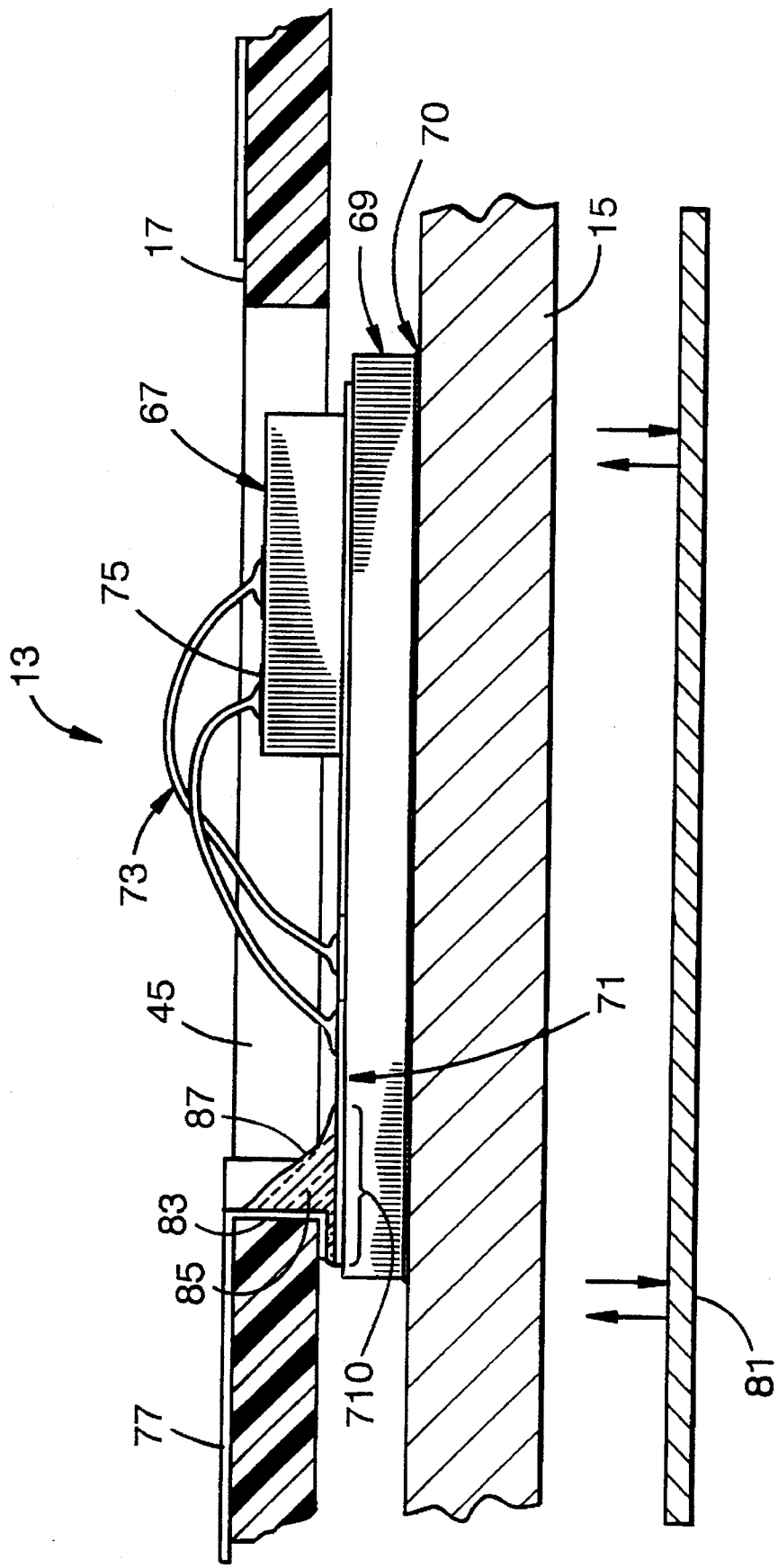
FIG. 12 is an enlarged side sectional view of the mounting arrangement of FIG. 11.

Referring to FIGS. 9 and 10, a power-dissipating component 13 is mounted on the baseplate 15 and attached to PCB 17 as follows. A semiconductor die 67 (the power dissipating device) is mounted on an electrically nonconductive substrate 69 (e.g., alumina ceramic). The substrate 69 is glued (using adhesive 70) on baseplate 15 and provides electrical isolation and efficient heat transfer between the die and the baseplate. Also formed on the substrate 69 are conductive pads 71 which are electrically connected by bond wires 73 to terminals 75 on the top of the semiconductor die 67.

One pad 71 extends under and is soldered directly to the semiconductor die (the solder is not shown). The extended pad may be used for making one of the electrical connections to the die, as the bottom surface of the semiconductor die is frequently one of the terminals of the device (e.g., the anode or cathode of a diode or the drain terminal of a field-effect transistor). The extended pad, if made of a material (e.g., copper) which has a thermal resistance much lower than that of the underlying substrate 69, will act as an essentially isothermal surface which spreads heat from the die over a relatively large surface of the substrate. This reduces the overall thermal resistance between the relatively smaller die 69 and the baseplate 15. The relatively large area of the conductive material of the pad, which might, for example, be 0.008 inch thick copper direct-bonded to the alumina substrate 69 (see Babcock et al., U.S. Pat. No. 3,766,634), provides a thermally conductive path for removing heat from the die and spreading the heat over a relatively large area of the surface of the substrate. By acting as an essentially isothermal surface, the extended pad provides means for passing heat down through a relatively large cross section of the substrate, thereby reducing the thermal resistance between the die and the baseplate and making this thermal resistance relatively independent of die size.

PCB 17 has a hole 45 through which the semiconductor die 69 and the bond wires 73 can pass, and several smaller holes 45a corresponding in number and location to the pads 71. A conductive run 77 is formed on the top and bottom surfaces of PCB 17 in the vicinity of each hole 45a and also through the holes themselves thus creating conductive through holes. Electrical connection between a conductive run 77 and the corresponding pad 71 is achieved by soldering (79), e.g., reflow soldering. The relatively large surface area between the solder and the inner wall of the through hole provides substantial mechanical strength to the solder bond.

This method of connecting a power-dissipating component to the PCB simplifies assembly. Because of efficient transfer of heat between baseplate 15 and substrate 69, solder 79 can be melted simply by applying a heat plate 81 to the bottom of baseplate 15 (see FIG. 9). Easy removal of the circuit board from the baseplate is also possible simply by again applying a heat plate to the bottom of the baseplate. This avoids tedious and destructive manual soldering and de-soldering.

One method of soldering the PCB to the substrate uses the inherent heat capacity of the baseplate itself. Solder paste of a known melting temperature (e.g., 183 degrees C.) is applied to the conductive runs 77, and the fully constructed PCB assembly is preheated to a fixed temperature which is consistent with the temperature ratings of the components mounted to the PCB (e.g., 125 degrees C.). This reduces the amount of heat subsequently required to melt the solder paste and also encourages out-gassing of volatile solvents that may be included in the solder paste. The baseplate 15, with the power dissipating components mounted on it, is heated to a temperature consistent with the temperature ratings of the power dissipating components (e.g., 250 degrees C.). Once the baseplate is up to temperature, it is removed from the heat plate 81 and the PCB is immediately placed down in direct contract with the substrates. The heat stored in the baseplate is transferred to the solder paste causing the paste to melt and a solder joint to be formed.

As seen in FIG. 10, hole 45 in PCB 17 saves space because the height of the semiconductor die 67 is coextensive with the height of the PCB 17.

Figure 13:
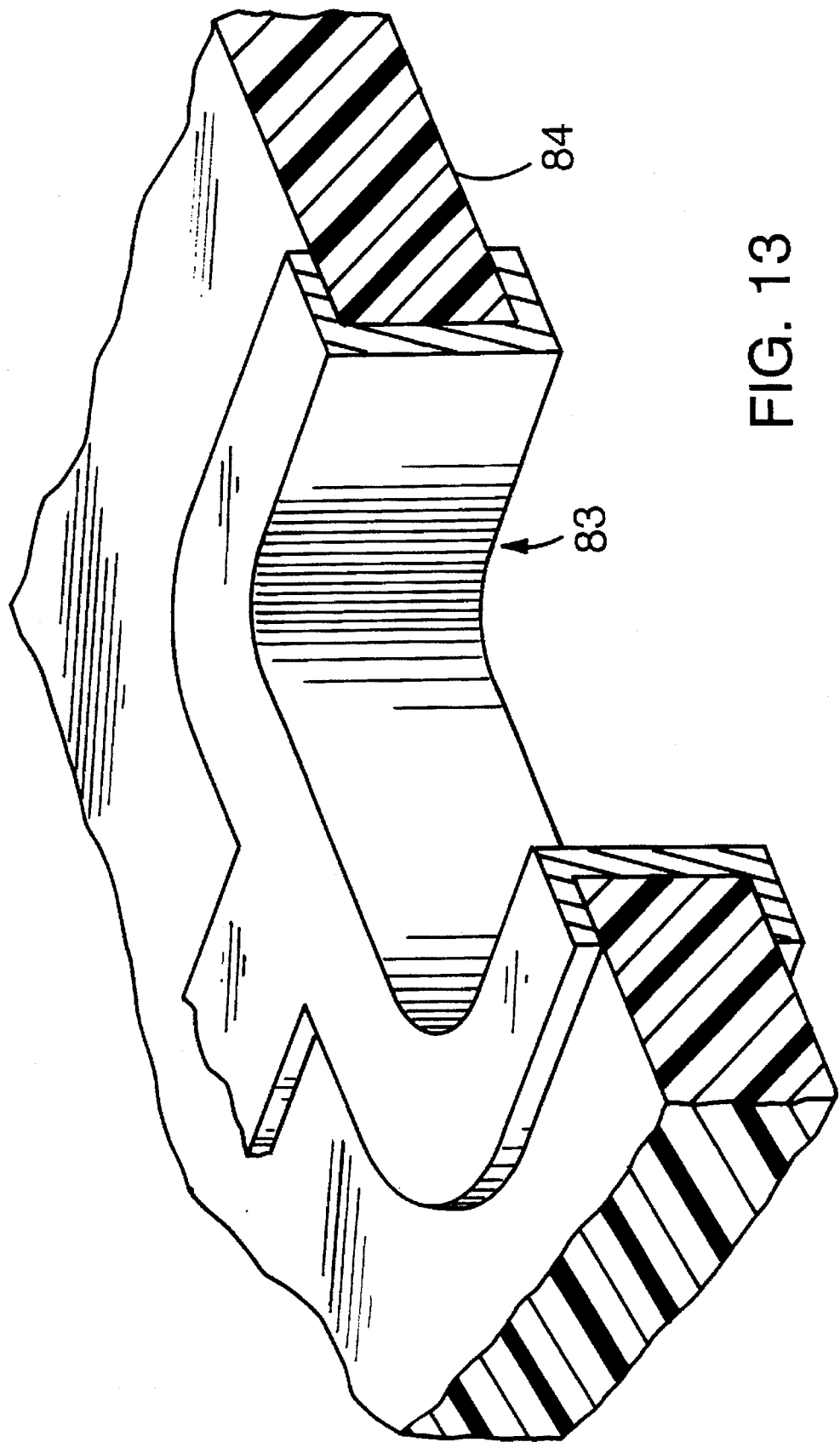
FIGS. 13 and 14 are enlarged perspective views of a scallop before and after soldering.
Figure 14:
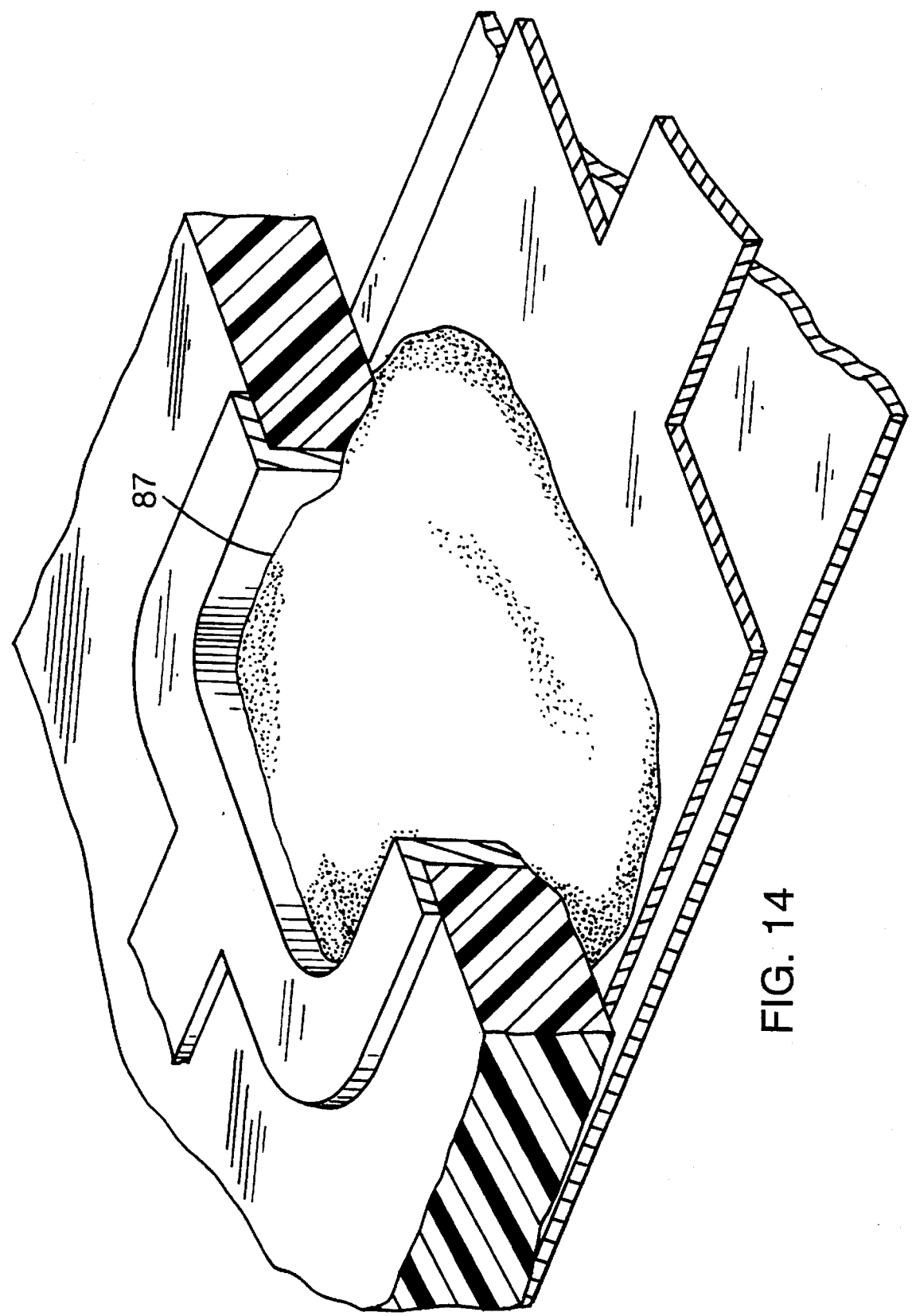

Referring to FIGS. 11–14, the plated-through holes 45a in FIGS. 9 and 10 may be replaced by plated scallops 83 in an edge 84 of hole 45. A scallop is a concave recess formed in an edge by removing material from the edge. The scallops 83 may be of virtually any shape, such as semi-circular (FIG. 11) or slotted (FIG. 13). As with plated through holes, the PCB 17 is mechanically and electrically connected to the power-dissipating component 69 when solder 85 flows and hardens between the scallops 83 on the PCB and the conductive runs 71 on the component. Unlike plated through holes, however, the scallops 83 do not confine the flow of solder 85, and instead allow the hardened solder 85 to form filleted joints 87. A fillet is the region enclosed by two non-parallel surfaces and a third, sloped, smooth surface which intersects both. Because each of the filleted solder joints 87 bonds to a much larger area 710 of the conductive run 71 than in the case of plated through holes, the scallops 83 provide stronger mechanical bonds. The scallops 83 also simplify the application of solder paste, as well as increase the speed and accuracy of defect inspection at the solder joints.

Referring to FIG. 15, the first step in forming the scallops is to create holes 89a, 89b, 89c in the copper-clad substrate 88 from which the PCB is formed, prior to forming hole 45. For semi-circular recesses, circular holes 89a and 89b are drilled into the substrate 88, and for slotted recesses, slotted holes 89c are routed into the substrate. The circular and slotted holes are then plated-through with a conductive material, such as copper. After the holes 89a, 89b, 89c are plated-through, hole 45, through which the semi-conductor die and the bond wires pass, is formed by routing the substrate. Half of each hole 89a, 89b, and 89c is removed as hole 45 is formed, thus producing the semi-circular and slotted recesses in the edges of hole 45.

Referring to FIG. 16, the rotating router bit 91 travels through the substrate 88 in the direction indicated by arrow 46, cutting a slot 100 which, when complete, results in the formation of hole 45. As hole 45 is routed and the router bit 91 passes through hole 89a, the rotation of the router bit 91 causes the router bit 91 to "grab" the edge 95 of the copper plating 97 in the hole 89a. Because copper is highly ductile, the grabbed edge 95 is deformed by the rotating bit 91, and a tail 93 of copper protrudes into the newly formed hole 45. The tail 93 may present several problems, including electrical shorting between layers of the PCB or shorting between adjacent scallops. To remove the tail 93 and eliminate any problems it may cause, the etching of the conductive pattern of the PCB is done after hole 45 is formed. In traditional circuit board production, holes 89a, 89b, 89c would be drilled and plated-through and the board would be etched before hole 45 would be formed, and, because of that sequence, tail 93 would not be removed.

A variety of other hole shapes could be used to form the scallops, and the routing process need not remove exactly half of the holes to form the scallops. In FIG. 17A, for example, a "C"-shaped scallop is formed in the substrate 88 when only a small part of circular hole 89a is removed. In FIG. 17B, most of circular hole 89b is removed to form an elbow-shaped scallop. In FIG. 17C, at least half of a diamond-shaped hole 89c is removed to form a triangular scallop. These examples illustrate the wide variety of possibilities.

Other embodiments are within the scope of the following claims. For example, the techniques could be used in housing a variety of devices other than the power converters used in the example given above.

What is claimed is:

1. A structure comprising:

a baseplate, a circuit board parallel and adjacent to the baseplate, the circuit board having an edge with a scallop formed in the edge, the scallop being plated with a conductive material, an electronic component including a power-dissipating surface and a pad for making electrical connection, the electronic component being mounted with the power-dissipating surface in contact with the baseplate, and the pad electrically connected to the conductive material.

2. The structure of claim 1 wherein the edge in which the scallop is formed is in an aperture of the board.

3. The structure of claim 1 wherein the electronic component includes a device that sits in the aperture.

4. The structure of claim 1 wherein the scallop comprises a recess having an edge which is a fraction of a cylinder.

5. The structure of claim 1 wherein the scallop comprises a recess having a slot-shaped edge.

6. The structure of claim 1 wherein solder connects the pad to the scallop.

7. The structure of claim 6 wherein the solder forms a fillet between the pad and the scallop.

8. The connection of claim 1 wherein the conductive material comprises metal.

9. A structure comprising:

a baseplate, a circuit board parallel and adjacent to the baseplate, the circuit board having an edge with a metal-plated scallop formed in the edge, the scallop comprising a recess having an edge which is a fraction of a cylinder, an electronic component including a power-dissipating surface and a pad for making electrical connection, the electronic component being mounted with the power-dissipating surface in contact with the baseplate, and the pad electrically connected to the metal-plated scallop by a fillet of hardened solder.

10. A method for mounting a power-dissipating component having a contact pad comprising:

mounting the component on a baseplate, placing a circuit board having an aperture over the component with at least part of the power-dissipating component lying in the aperture, a plated scallop being formed in an edge of the aperture, and soldering the pad to the scallop.

11. The method of claim 10 wherein the scallop is formed in the edge of the aperture by forming a hole in the circuit board, applying a conductive material to an inner wall of the hole, and routing, into the circuit board, the aperture such that the aperture consumes a portion of the hole, the portion of the hole not consumed by the aperture forming the scallop.

12. The method of claim 10 wherein the scallop comprises a recess having an edge which is a fraction of a cylinder.

13. The method of claim 10 wherein the scallop comprises a recess having a slot-shaped edge.

14. The method of claim 10 wherein the conductive material comprises metal.

15. The method of claim 10 wherein soldering the pad to the scallop comprises forming a fillet of hardened solder between the pad and the scallop.

* * * * *

UNITED STATES PATENT AND TRADEMARK OFFICE
CERTIFICATE OF CORRECTION

PATENT NO. : 5,644,103

DATED : July 1, 1997

INVENTOR(S) : Stephen R. Pullen; Walter R. Hedlund, III

It is certified that error appears in the above-identified patent and that said Letters Patent is hereby corrected as shown below:

Title page, Section [56], "References Cited", under "U.S. Patent Documents", change inventor listed for reference "4,417,296" from "Shelhorn" to --Schelhorn--.

Col. 4, line 45, after "sharp serrations", insert -- (e.g., ridges ------.

Signed and Sealed this

Sixth Day of October, 1998

Attest:

BRUCE LEHMAN

Attesting Officer

Commissioner of Patents and Trademarks